(12) United States Patent
Florez

(10) Patent No.: US 6,460,554 B2
(45) Date of Patent: *Oct. 8, 2002

(54) APPARATUS FOR RINSING AND DRYING SEMICONDUCTOR WAFERS IN A CHAMBER WITH A MOVABLE SIDE WALL

(75) Inventor: Barry K. Florez, Meridian, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/942,138

(22) Filed: Aug. 29, 2001

(65) Prior Publication Data

US 2002/0005215 A1 Jan. 17, 2002

Related U.S. Application Data

(63) Continuation of application No. 09/543,142, filed on Apr. 5, 2000, now Pat. No. 6,354,313, which is a continuation of application No. 09/358,250, filed on Jul. 21, 1999, now Pat. No. 6,095,167, which is a continuation of application No. 09/299,312, filed on Apr. 26, 1999, now Pat. No. 5,985,041, which is a continuation of application No. 09/035,328, filed on Mar. 5, 1998, now Pat. No. 5,913,981.

(51) Int. Cl.[7] ................................................. B08B 3/04
(52) U.S. Cl. ........................ 134/183; 134/186; 134/902
(58) Field of Search ................................. 134/182, 183, 134/186, 902, 95.2

(56) References Cited

U.S. PATENT DOCUMENTS

| | | | |
|---|---|---|---|
| 2,713,347 A | * | 7/1955 | Hazy |
| 2,809,752 A | | 10/1957 | Leslie |
| 3,908,206 A | | 9/1975 | Grewing |
| 5,022,419 A | | 6/1991 | Thompson et al. |
| 5,115,576 A | | 5/1992 | Roberson, Jr. et al. |
| 5,190,064 A | | 3/1993 | Aigo |
| 5,474,616 A | | 12/1995 | Hayami et al. |
| 5,520,744 A | | 5/1996 | Fujikawa et al. |
| 5,524,361 A | | 6/1996 | Dexter et al. |
| 5,540,257 A | | 7/1996 | Guilleux |
| 5,571,337 A | | 11/1996 | Mohindra et al. |
| 5,634,978 A | | 6/1997 | Mohindra et al. |
| 5,635,053 A | | 6/1997 | Aoki et al. |
| 5,653,045 A | | 8/1997 | Ferrell |
| 5,656,097 A | | 8/1997 | Olesen et al. |
| 5,743,280 A | | 4/1998 | Han |
| 5,839,459 A | | 11/1998 | Bisby |
| 5,913,981 A | | 6/1999 | Florez |
| 5,921,257 A | * | 7/1999 | Weber et al. |
| 5,975,097 A | | 11/1999 | Yonemizu et al. |
| 5,985,041 A | | 11/1999 | Florez |
| 6,145,520 A | * | 11/2000 | Schild |
| 6,165,277 A | | 12/2000 | Florez |

FOREIGN PATENT DOCUMENTS

| | | | | |
|---|---|---|---|---|
| JP | 62-279640 | * | 12/1987 | |
| JP | 63-184350 | | 7/1988 | ................. 134/902 |
| JP | 6-85859 | | 3/1994 | ................. 134/902 |
| JP | 64-57624 | | 3/1999 | ................. 134/902 |

\* cited by examiner

Primary Examiner—Frankie L. Stinson
(74) Attorney, Agent, or Firm—TraskBritt

(57) ABSTRACT

A method and apparatus for rinsing and drying semiconductor wafers. The apparatus includes side walls, end walls and a base. At least a portion of the wall descends relative to the base to facilitate the flow of liquid from the chamber. One embodiment of the apparatus includes a rigid side and end walls. In another embodiment of the apparatus, at least a portion of the side wall is collapsible. In yet another embodiment of the apparatus, at least a portion of the wall has a tambour configuration, facilitating bending or rolling of the wall beneath the base. The apparatus includes an assembly for injecting a rinse liquid into the chamber. The method includes placing a semiconductor wafer into a rinse/dry apparatus, directing rinse liquid over the semiconductor wafer, and lowering a side wall of the rinse/dry apparatus to remove rinse liquid therefrom. The apparatus also includes an assembly for injecting a drying fluid into the chamber.

28 Claims, 7 Drawing Sheets

APPARATUS FOR RINSING AND DRYING SEMICONDUCTOR WAFERS IN A CHAMBER WITH A MOVABLE SIDE WALL

CROSS REFERENCE TO RELATED APPLICATIONS

This application is a continuation of application Ser. No. 09/543,142, filed Apr. 5, 2000, now U.S. Pat. No. 6,354,313 B1, issued Mar. 12, 2002, which is a continuation of application Ser. No. 09/358,250, filed Jul. 21, 1999, now U.S. Pat. No. 6,095,167, issued Aug. 1, 2000, which is a continuation of application Ser. No. 09/299,312, filed Apr. 26, 1999, now U.S. Pat. No. 5,985,041, issued Nov. 16, 1999, which is a continuation of application Ser. No. 09/035,328, filed Mar. 5, 1998, now U.S. Pat. No. 5,913,981, issued Jun. 22, 1999.

BACKGROUND OF THE INVENTION

1. Field of the Invention

The present invention relates to apparatus and methods for rinsing and drying semiconductor wafers and other semiconductor substrates that are used to fabricate semiconductor dies, which are also known as integrated circuit dies. Particularly, the present invention relates to apparatus for rinsing and drying semiconductor wafers without requiring physical transfer of the individual wafers between locations between the rinsing and drying steps. More particularly, the present invention relates to apparatus and methods for rinsing and drying wafers which utilize a drying compound. A preferred apparatus according to the invention evacuates water slowly from the semiconductor wafers during drying of the wafers. A preferred drying compound for use in the apparatus and method of the present invention is a non-heated isopropyl alcohol (IPA) vapor. The present invention also relates to a chamber in which wafers are rinsed and dried.

2. Background of Related Art

A continuing goal of integrated circuit processing is to produce wafers having ever-fewer and ever-smaller particles of contamination per semiconductor wafer. Another goal of integrated circuit processing is to clean the ever-thinner, ever-larger (i.e., which are increasing from 6 to 8 to 10 inches in diameter), state-of-the-art semiconductor wafers without breaking or otherwise damaging them. Several processes and apparatus have been developed for removing different types of contamination from the surfaces of semiconductor wafers, including without limitation silicon, gallium arsenide, silicon-on-glass (SOG), silicon on sapphire (SOS), silicon on insulator (SOI), and other semiconductor wafers known in the art. Many such processes involve the use of chemicals. The need for atomically clean surfaces requires the complete rinsing of all chemicals and debris from the wafer surface. Clean wafers are essential at all stages of the fabrication process but are especially necessary before any of the operations performed at high temperature.

Several rinsing and drying methods are known and used in the relevant industry. One such method is known as the "quick dump" method, wherein the wafers are placed into a rinse tank and submerged in de-ionized (DI) water or any other suitable rinse liquid to wash solvent, rinse acids and/or rinse bases, and contaminants from the surface of the wafers. Some dump rinsers spray the water onto the wafers. The water is then quickly removed from the rinse tank. Other dump rinsers have a flow meter, which controls the rate at which water exits the chambers. The rinse-dump process may be repeated several times in order to further decrease the number of contaminants on the wafers.

Even with repetitive cycles, the "quick dump" method often leaves particles on the wafer, making that method undesirable for many applications. This is principally due to the rapid deployment of water from the rinse tank, which often transfers many of the contaminants back onto the wafer. The quick discharge of water from the rinse tank and the resultant quick flow of air into the tank also create friction with the surface of the wafers, which tends to generate an electrostatic charge on the surfaces of the wafers, increasing their tendency to attract contaminants. The number of contaminant particles often correlates to lower die yields on the semiconductor wafer. Further, many quick dump rinsers are not equipped to dry the wafers, which requires physical transfer of the wafers to a separate device and increases the cleaning time and cost of the finished product. Use of separate rinsing and drying devices may also increase the possibility of additional contaminants adhering to the wafers.

Devices known as overflow washers have also been used in the industry. Overflow washers include a rinse tank which has a continuous supply of a rinse liquid, such as DI water. The rinse liquid flows into many overflow rinsers through the bottom of the rinse tank. As the tank fills with fresh, clean water, dirtier water is removed from the upper portion of the rinse tank. Many overflow washers also include a bubbler, which introduces a stream of nitrogen bubbles into the bottom of the rinse tank to enhance the rinsing action of the flowing water. As the nitrogen bubbles move up through the water and past the wafers, the bubbles facilitate the mixing of the chemicals on the wafer surface with the rinse liquid.

Many overflow washers employ resistivity meters to determine the duration of the rinsing process. Such meters determine the resistivity of the rinse liquid that exits the rinse tank. Chemicals which were used to clean the wafers dissolve into the rinse liquid and act as charged particles. In this fashion, the resistivity meter detects the presence of chemicals based on the resistivity of the rinse liquid. For example, if the rinse liquid entering the rinser has a resistivity of 18 mega ohms, a reading of 15 to 18 mega ohms on the exit side indicates that the wafers are cleaned and rinsed.

Due to its utilization of large volumes of rinse liquid, overflow rinsing is perceived as undesirable to many in the industry. Further, many overflow rinsers are not capable of drying the wafers. Thus, drying requires movement of the wafers to a dryer, which increases the cleaning time, processing cost, and the possibility that additional contaminants will adhere to the surface of the wafers. Due to these shortcomings, many overflow rinsers do not adequately reduce the level of contamination on the wafer surfaces.

Another type of rinsing apparatus which has found widespread use in the industry is the cascade washer, which includes a series of adjacent overflow washers. In use, fresh rinse liquid flows into the first, highest washer of the series. As water fills the first overflow washer and then discharges, it enters the second, which fills and then discharges into the third, and so forth. Wafers are first placed in the last washer of the series, which has the most contaminated rinse liquid supply from the cleaning of one or more preceding wafers or sets of wafers. The wafers are then sequentially repositioned into each adjacent washer until they are eventually washed in the first overflow washer, which has the freshest and cleanest water supply.

The effectiveness of many cascade rinsers is often limited because "dirty water" may be present in the first chamber. The dirty water typically includes residual acid and particles from preceding wafers or sets of wafers. Some of the residual particles tend to attach to the wafer, which can cause defects in an integrated circuit fabricated thereon, thereby reducing the number of good dies on a typical wafer. As noted above, cascade rinsers also require repeated movement of the wafers from chamber to chamber, which increases the cleaning time. Generally, cascade rinsers lack a drying mechanism, making such rinsers further undesirable due to the aforementioned contamination problems associated with handling of the wafers. The wafers must also be physically transferred to a drying apparatus. Subsequent drying operations may also introduce more particles onto the wafers, which may decrease the number of good dies on each of the wafers.

U.S. Pat. No. 5,635,053, issued in the names of Aoki et al. (the "'053 Patent"), discloses another method and apparatus for rinsing wafers. The method of the '053 Patent involves rinsing with an anolyte or a catholyte electrolytic ionized water (EIW) which has been produced from DI water. The pH of the EIW is selected based upon the cleaning agents used on the wafers in preceding cleaning steps.

The rinsing method of the '053 Patent is undesirable due to the additional costs associated with electrolytically ionizing water. In addition, the apparatus described in the '053 patent does not dry the wafers, introducing the potential problems identified above with other devices which do not rinse and dry wafers.

After the wafers have been rinsed, they must be dried. The presence of any amount of residual water on the surface of a wafer (even atoms) has the potential of interfering with each subsequent operation. Known methods for drying wafers include spin rinse drying, the use of hot water, and the use of drying chemicals.

Spin rinse dryers have been used in the art to dry wafers or to rinse and dry wafers. Spin rinse dryers employ a combination of rinse liquid spray and centrifugal force to remove contaminants and rinse liquid from the wafer. Many spin rinse dryers also spray hot nitrogen gas onto the wafers during spinning. U.S. Pat. No. 5,022,419, issued to Thompson et al., discloses an automated spin rinse dryer with a removable heated chamber bowl which is preferably mounted at an angle to facilitate the gravitational flow of effluent drainage from the chamber. That device also includes a broken chip collector, an acidity sensor, and an exhaust manifold assembly.

Many spin rinse dryers tend to generate undesirable amounts of static charge during their spin cycles. Some of the static charge collects on the surfaces of the wafers, attracting contaminants thereto. Many spin rinse dryers also tend to damage or break the delicate larger and/or thinner wafers that are presently being used in the industry.

Another drying technique which is used in the industry includes the use of hot DI water. Hot DI water evaporates more quickly than DI water at ambient temperatures (i.e., room temperature DI water). However, the use of hot DI water is undesirable in that it may introduce stains on the wafer. Additionally, hot DI water is an aggressive solvent that often deteriorates equipment, thereby increasing maintenance operation costs. Heating the DI water also adds to the cost of cleaning the wafers.

Processes and apparatus which utilize drying fluids are also used in the industry for drying the rinse liquids from wafers. Conventional isopropyl alcohol (IPA) mist or fog systems and full displacement systems are capable of producing a wafer having a very dry surface finish, a very low particle contamination count, and little or no electrostatic charging of the wafers. In many IPA systems, the wafer must be transferred from a separate rinse apparatus to a self-contained drying module. Many IPA drying apparatus direct a pressurized IPA stream to a heated plate in order to produce a hot IPA mist or fog which dries the wafer. When wafers are dried in systems which utilize cleaning fluids, little or no electrostatic charge develops on the wafers.

The following U.S. Patents disclose methods for drying semiconductor wafers using drying fluids: U.S. Pat. No. 5,653,045, issued to Ferrell (the "'045 Patent"); U.S. Pat. No. 5,634,978, issued to Mohindra et al. (the "'978 Patent"); and U.S. Pat. No. 5,571,337, issued to Mohindra et al. (the "'337 Patent"). The '045 Patent discloses a method and apparatus for drying semiconductor wafers with a mist or fog of drying fluid. The '978 and '337 Patents each disclose a method and apparatus in which wafers are immersed in a water-containing liquid, the water-containing liquid is displaced with a gaseous mixture, and a drying fluid is pulsed at the edges of the wafers to remove liquid therefrom.

However, IPA and many other cleaning fluids are highly flammable. Thus, special safety precautions are necessary to avoid fires when heating such cleaning fluids. Some such dryers utilize large quantities of drying fluids, which can pose health and environmental hazards. Additionally, large quantities of some hot solvents can be incompatible with certain resist patterned wafers.

What is needed is a method and apparatus for rinsing and drying semiconductor wafers that effectively reduces levels of contaminants remaining on the wafers. A wafer-cleaning method and apparatus that create little or no static charge on the wafers and that adequately clean relatively large and thin, state-of-the-art wafers without tending to damage or break the wafers are needed. There is a further need for a method and apparatus that eliminate the need for transferring wafers between rinsing and drying steps, reduce the amounts of rinse liquids and drying fluids consumed, and otherwise reduce costs associated with cleaning wafers.

SUMMARY OF THE INVENTION

The apparatus and method of the present invention address each of the foregoing needs. The present invention includes an apparatus for rinsing and drying semiconductor wafers in a manner which reduces the level of contaminants which remain on the surface of the wafer. The apparatus provides improved control over the removal rate of rinse liquid in comparison to that afforded by many devices in the prior art. Further, little or no electrostatic charge is generated on the surface of the wafers during either rinsing or drying. Relatively large and thin wafers may be rinsed and dried in the apparatus according to this invention with reduced damage or breakage when compared with many conventional rinsing and drying systems. The apparatus of this invention eliminates the need for physically transferring wafers to a different location between rinsing and drying steps and reduces the amount of rinse liquids and drying fluids consumed, which also reduces costs associated with cleaning semiconductor wafers. The invention also includes a method for rinsing and drying wafers with the apparatus of the present invention.

The apparatus of the present invention includes a housing which contains a rinse/dry chamber, a rinse liquid injection assembly directed toward the rinse/dry chamber, a drying fluid injection assembly directed toward the rinse/dry chamber, and a drain. The rinse/dry chamber is a watertight chamber which includes a base and end and side walls extending upwardly from the perimeter of the base. A section of at least one of the end or side walls lowers at a desired rate relative to the base. Preferably, both of the side walls descend relative to the base. The base of the rinse/dry chamber is preferably adapted to securingly engage a wafer boat. The rinse liquid injection assembly of the preferred embodiment of the apparatus directs a pressurized liquid spray over the substantially flat surfaces of each of the wafers carried by a carrier that is placeable therein. Similarly, the drying fluid injection assembly directs drying fluid at the substantially flat surfaces of each of the wafers placed in the rinse/dry chamber.

The present invention also provides an apparatus which effectively removes contaminants from the surfaces of semiconductor wafers. A preferred embodiment of the apparatus according to the present invention sprays a high pressure stream of rinse liquid onto the substantially flat surfaces of the wafers placed therein. As the rinse/dry chamber becomes filled with rinse liquid, the side walls are lowered to facilitate the removal of the rinse liquid from the wafers. Preferably, concurrently with the removal of water from the wafers, the drying fluid injection assembly injects drying fluid onto the rinse liquid surface to facilitate the removal of rinse liquid from the wafer surfaces. Preferably, the process is repeated, if necessary, to further decrease the level of contamination on the wafers. In another use of the apparatus of the present invention, the rinse/dry chamber may be filled with rinse liquid prior to placement of the wafers therein. Consequently, the apparatus of the present invention effectively removes contaminants from the semiconductor wafers placed therein.

Reduced levels of electrostatic charge on the surfaces of the wafers are also desired. Electrostatic charges on the surfaces of semiconductor wafers are usually generated by friction on those surfaces. Preferably, the rinse/dry chamber wall is lowered at a very slow rate to remove rinse liquid from the wafers. Thus, friction caused by rapid rinse liquid removal is minimized. Advantageously, the wafers also remain stationary during drying. Thus, little, if any, air current is generated over the surfaces of the wafers, which further reduces friction against the wafers. Therefore, it is a consequent advantage that the apparatus of the present invention generates little or no electrostatic charge on the surfaces of the wafers rinsed and dried therein.

A device is also needed to effectively rinse and dry relatively thin and large wafers without breaking or otherwise damaging the wafers. Preferably, the pressure with which the apparatus of this invention directs rinsing fluid on the surfaces of the wafers is variable. Thus, the pressure is adjustable to a level which adequately cleans the wafers without damaging them. Similarly, the streams of rinsing fluid are oriented to effectively clean the surfaces of the semiconductor wafers while reducing the likelihood of damaging the same. The apparatus of the present invention also dries wafers with drying fluids, including without limitation isopropyl alcohol, propylene, and other drying fluids which have a lower surface tension than the surface tension of the rinse liquid. The wafers remain stationary during drying. The wafers also remain stationary in the rinse/dry chamber during the rinsing and drying steps, eliminating the need for transferring the wafers from a rinsing device to a drying device. Consequently, the apparatus of the present invention reduces the incidence of wafer damage caused during rinsing, drying, and physical transferring of the wafers in accordance with conventional practice.

A reduction in the costs associated with cleaning wafers is also desired by those in the industry, as a reduction in cleaning costs reduces the overall fabrication cost of the final semiconductor die products. The apparatus of the present invention eliminates the need for transferring wafers from a rinsing device to a drying device. The apparatus also creates little or no electrostatic charge on the wafers, which tends to further reduce contamination of the dies and, correspondingly, increase the number of good dies on a wafer. The apparatus of this invention effectively rinses and dries with inexpensive rinse liquids and drying fluids and utilizes lower amounts of such rinse liquids and drying fluids. Thus, cleaning costs are reduced with use of the apparatus of the present invention. Specifically, costs and contamination related to the physical transfer of wafers between rinsing and drying steps are eliminated by the method and apparatus of the present invention. Similarly, costs are further reduced since the apparatus and method of the present invention use smaller amounts of rinse liquids and drying fluids relative to some presently used apparatus.

Other advantages of the present invention will become apparent to those of ordinary skill in the relevant art through a consideration of the appended drawings and the ensuing description.

DETAILED DESCRIPTION OF THE INVENTION

Figure 1:
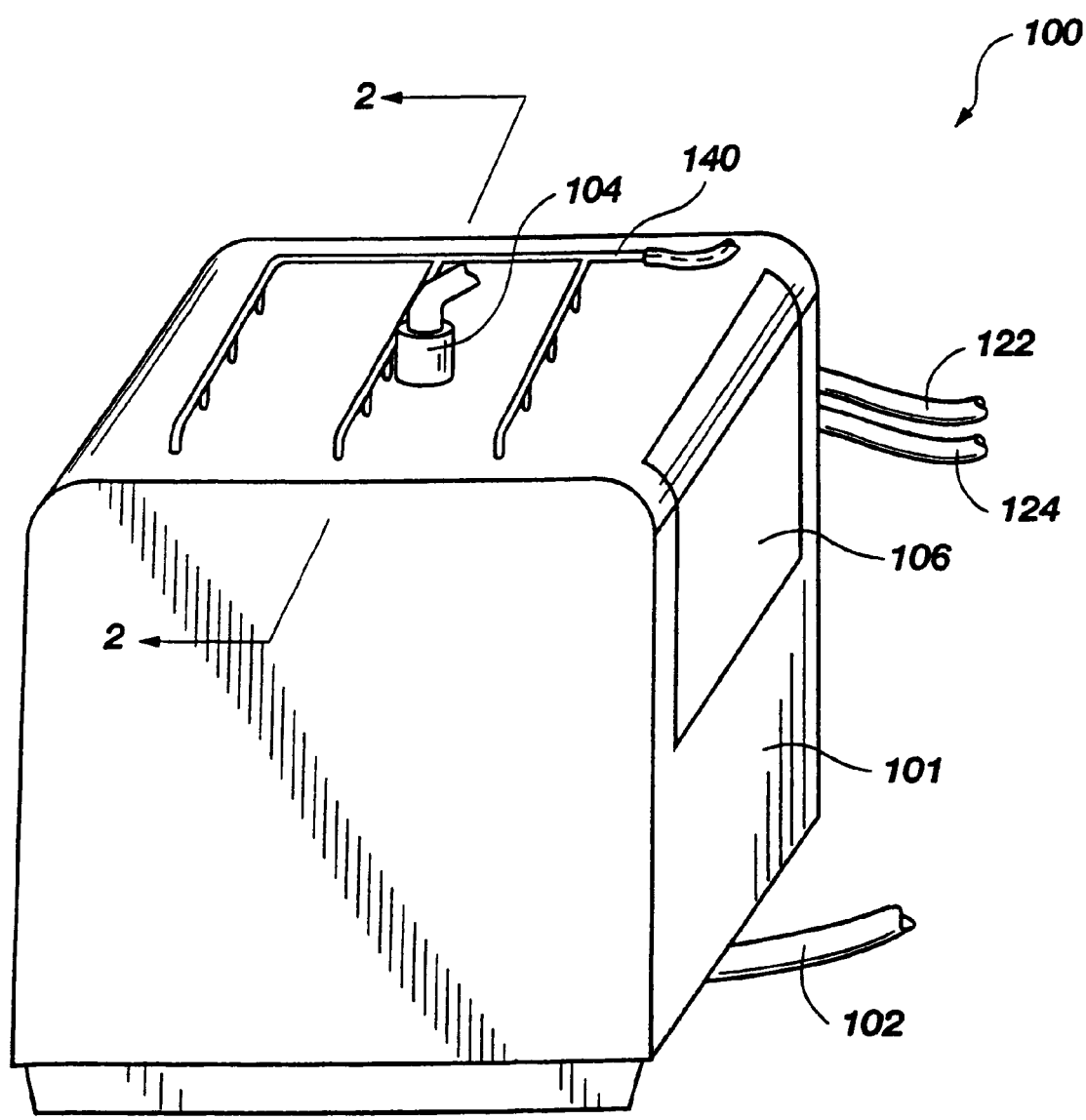
FIG. 1 is a perspective view of a preferred embodiment of a rinse dryer according to the present invention.
Figure 2:
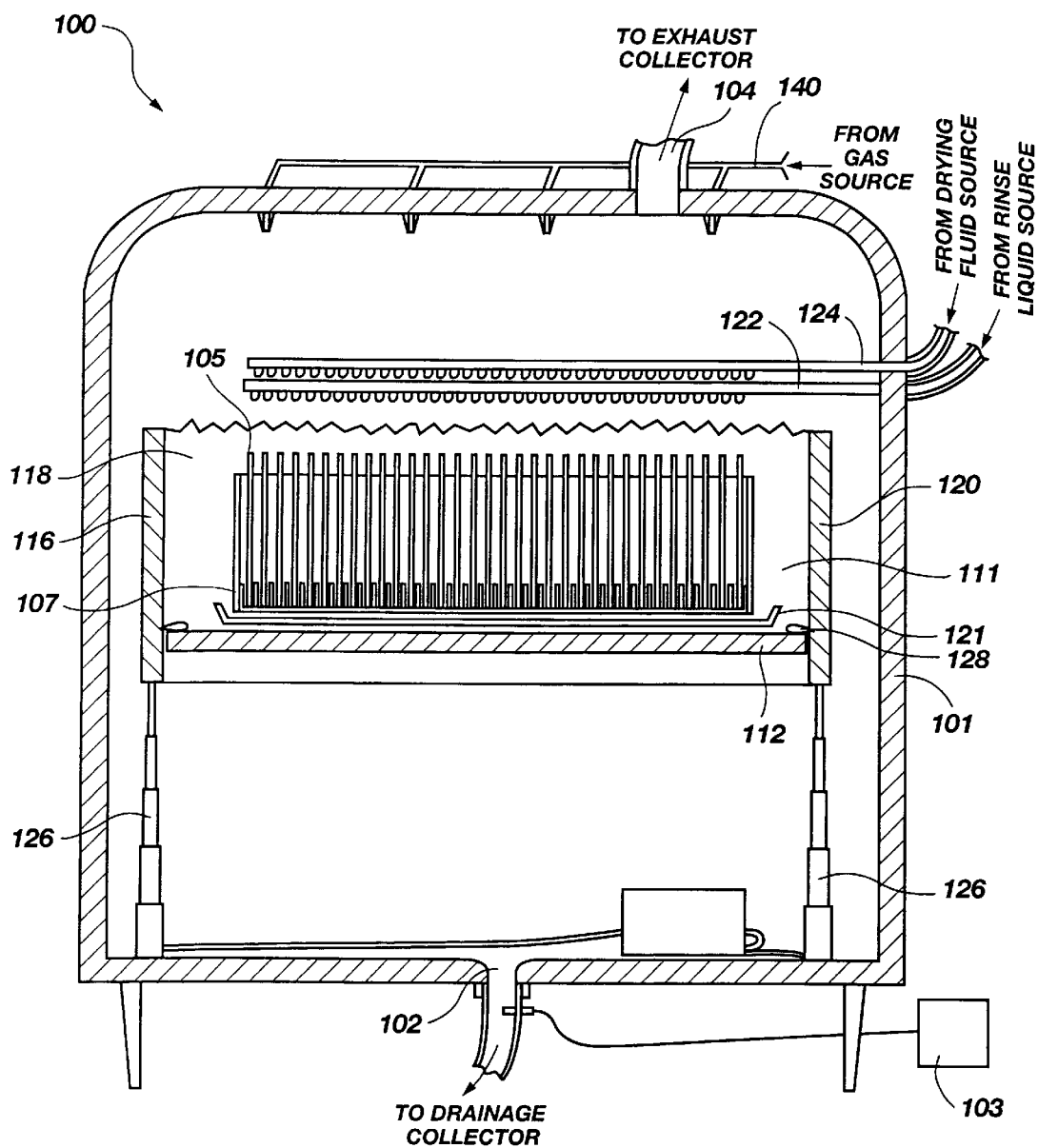
FIG. 2 is a cross-section taken through line 2—2 of FIG. 1.

With reference to FIGS. 1 and 2, a preferred embodiment of the drop side wafer rinse dryer 100 according to the present invention is shown. Referring to FIG. 2, rinse dryer 100 includes a base 112 with side walls 114, 118 (FIG. 3a) and end walls 116, 120 disposed about and extending upwardly from the perimeter thereof to define a rinse/dry chamber 111. Side walls 114, 118 or a portion thereof descend and ascend relative to base 112 while preferably remaining in contact therewith to hold water in chamber 111 during descent of the wall. The upper edges of side walls 114, 118 are preferably serrated or saw tooth-configured in order to facilitate the smooth flow of liquids thereover. Rinse dryer 100 also includes a rinse liquid injection assembly 122 and a drying fluid injection assembly 124, both of which are directed toward base 112. Rinse dryer 100 may also include a gas injection assembly 140.

Preferably, chamber 111 and portions of rinse liquid injection assembly 122 and drying fluid injection assembly 124 are contained within an outer housing 101. Outer housing 101 also includes a drain 102 at the bottom thereof for removing fluids, vapors and the like from the outer housing 101. A resistivity meter 103 of the types which are known in the relevant art may be positioned in drain 102 to measure the resistivity of the rinse liquid as it drains from outer housing 101. Outer housing 101 may also include an exhaust conduit 104 for removal of vapors and gases therefrom under a pressure differential. Preferably, wafers 105 are loaded onto a carrier 107, then inserted into outer housing 101 through a door 106 (shown in FIG. 1) positioned on the side of the outer housing. However, the door may be located on any part of the outer housing, such as at the top thereof in order to facilitate the insertion of a loaded wafer carrier 107 into a pre-filled chamber 111. Preferably, the dimensions and placement of door 106 allow for the ready insertion of wafers 105 into outer housing 101 and onto base 112 without damage to the wafers.

Preferably, base 112 is configured to hold and securely engage a wafer carrier 107 of a conventional type known and used in the industry, including without limitation flats, slabs, slotted flats, cradles, slotted cradles, and others. Base 112 may also include a removable tray 121, which is located above the base and beneath a wafer boat placed thereon to catch and hold fragments of wafers that may be broken off of wafers 105 during rinsing and drying thereof. Preferably, tray 121 is formed from a mesh, screen, or a substantially flat element which otherwise defines apertures that permit the flow of liquids such as water therethrough.

Figure 3A:
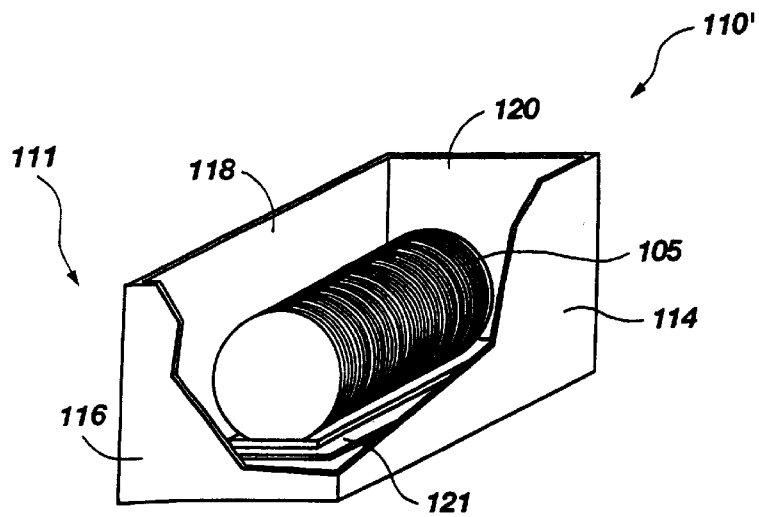
FIG. 3a is a perspective cutaway view of a preferred embodiment of a rinse/dry chamber for use in the rinse dryer of the present invention.

Side walls 114, 118 and end walls 116, 120 preferably meet at the two adjacent sides of their lateral edges. The adjacent lateral edges of side walls 114, 118 and end walls 116, 120 may be fixedly attached to one another, as shown in FIG. 3a, or they may slide relative to each other and form a watertight seal when each of them is in a raised or partially raised position, as shown in FIGS. 3b and 3c.

Figure 3B:
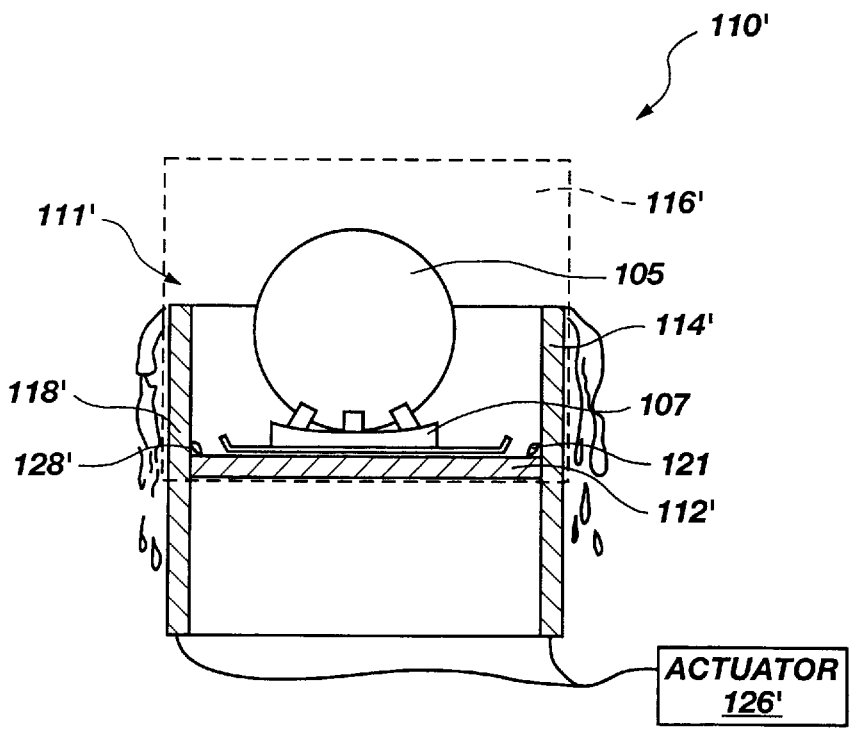
FIG. 3b is a sectional view illustrating a variation of the embodiment of the rinse/dry chamber shown in FIG. 3a, with the side walls in a partially lowered position.
Figure 3C:
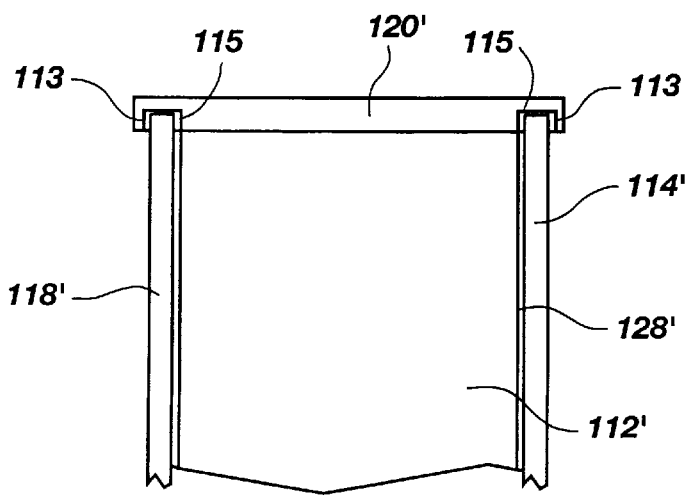
FIG. 3c is a partial top plan view of the variation of the rinse/dry chamber shown in FIG. 3b, which does not illustrate a semiconductor wafer, a carrier or a tray.

With continued reference to FIGS. 3b and 3c, end walls 116' and 120' include vertical slots 113 formed therein, adjacent each lateral edge of end walls 116', 120'. Each of slots 113 is configured to receive the adjacent lateral edges of side walls 114', 118'. An elastomeric seal 115 is disposed within each of slots 113 to impart chamber 111' with watertightness as side walls 114', 118' are in the raised position relative to base 112'. Alternatively, seals 115 may be configured as labyrinth seals and disposed within each of slots 113 or in the corner formed between the adjacent lateral edges of a side wall and end wall. A suitable elastomeric seal 115 material is durable, flexible, forms a tight contact with each of the surfaces it abuts, and withstands repeated and prolonged exposure to the rinse liquids, drying fluids, gases, other chemicals, temperatures, pressures and other conditions to which the apparatus of the invention is exposed. Preferred materials for such use include, without limitation, silicone rubber, other rubbers and elastomeric materials which have the above-identified properties.

Upwardly and downwardly moveable portions of side walls 114', 118' are operatively connected to an actuator 126', which controls the ascent and descent of those parts of the wall. Actuator 126' may comprise a pneumatic cylinder, an hydraulic cylinder, a stepper motor, a screw drive, or any other type of suitable actuation mechanism. Preferably, the rate at which actuator 126' lowers side walls 114', 118 ' or a portion thereof is adjustable, which facilitates modification of the rate at which water flows over the upper edge of the wall and out of chamber 111' as the wall is lowered relative to base 112'. The rinse/dry apparatus 110' depicted in FIG. 3a employs a similar type of actuator, which is associated with side walls 114, 118 or end walls 116, 120 in the same fashion that actuator 126' is connected to side walls 114', 118'.

Preferably, the upper edge of side walls 114', 118' or the portion thereof which ascends and descends relative to base 112' descends below the location of the bottom-most edge of a wafer 105 positioned in carrier 107 resting on base 112'. Thus, the surface of rinsing fluid on base 112' may be lowered below the bottom edge of wafers 105.

With continued reference to FIGS. 3b and 3c, one or more seal elements 128' are disposed between base 112' and side walls 114', 118' to form a watertight seal therebetween. Seal elements 128' facilitate the retention of liquid within chamber 111' while side walls 114', 118' are in the raised position, and as the side walls are being lowered relative to base 112'. Thus, seal elements 128' are preferably disposed about the outer periphery of base 112'. A suitable seal element 128' material has the same properties described above in reference to elastomeric seal 115, and may comprise the elastomeric materials described above in reference to elastomeric seal 115. Seal elements 128' may be of round cross-section, or comprise a flap or lip, as shown, for compliant contact with moving side walls 114', 116'. Chamber 111 (see FIG. 2) includes similar seal elements 128.

Figure 4:
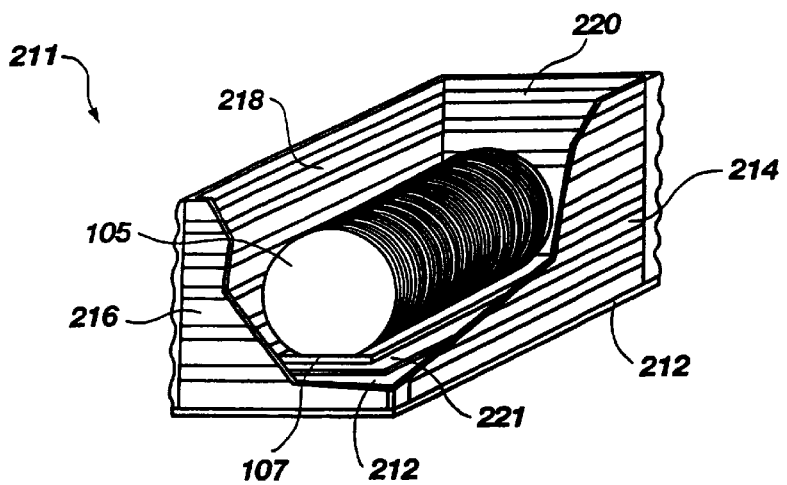
FIG. 4 is a perspective cutaway view of a second preferred embodiment of a rinse/dry chamber for use in the rinse dryer of the present invention.

FIG. 4 shows a second preferred embodiment of a rinse/dry chamber 211 according to the present invention, wherein the chamber includes a base 212, end walls 216, 220 that extend upwardly from the perimeter of the base, and collapsible side walls 214, 218 which are upwardly extendable around the perimeter of the base. Side walls 214, 218 and end walls 216, 220 each collapse in an accordion-like manner and each of the lateral edges of side walls 214, 218 are preferably joined to the two adjacent end walls 216, 220, with a flexible, collapsible material. Side walls 214, 218 and end walls 216, 220 are preferably made from a flexible, durable, water-impermeable material which will withstand repeated and prolonged exposure to the rinse liquids, drying fluids, gases, other chemicals, temperatures, pressures and other conditions to which the wall will be exposed in the apparatus of the present invention. Materials such as coated nylon fabrics, coated flexible metal meshes, thermoplastic films, and others are useful for making side walls 214, 218 and end walls 216, 220.

The lower edge of each of side walls 214, 218 and end walls 216, 220 forms a watertight seal with base 212. The upper edge of at least a portion of side walls 214, 218, which is operatively connected with an actuator (not shown), is movable upwardly and downwardly with respect to base 212. End walls 216, 220 or a portion of either of them may also be operatively connected with an actuator 126' (see FIGS. 3b and 3c). The actuator may comprise a pneumatic cylinder, an hydraulic cylinder, a stepper motor, a screw drive, or any other suitable actuation device, such as those previously described in conjunction with the rinse/dry apparatus 110 and 110' of FIGS. 1 through 3c.

Figure 4A:
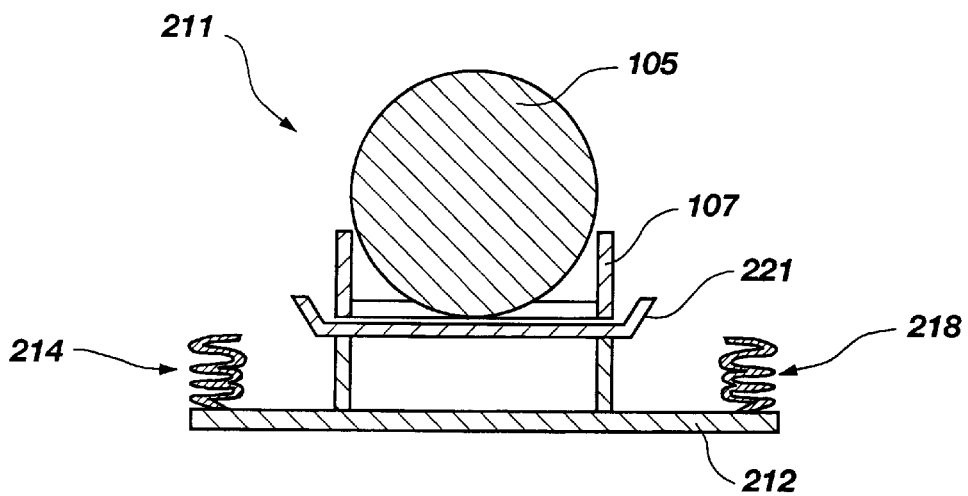
FIG. 4a is a cross-section of the embodiment shown in FIG. 4, with the wall in a lowered position.

Chamber 211 may also include a removable tray 221, disposed upon base 212. A wafer carrier 107, which carries wafers 105, secures to base 212 above tray 221. Removable tray 221 has the same basic configuration and serves the same function as tray 121, disclosed above in reference to FIG. 1. FIG. 4a is a sectional view showing side walls 214, 218 in a lowered position.

Figure 5:
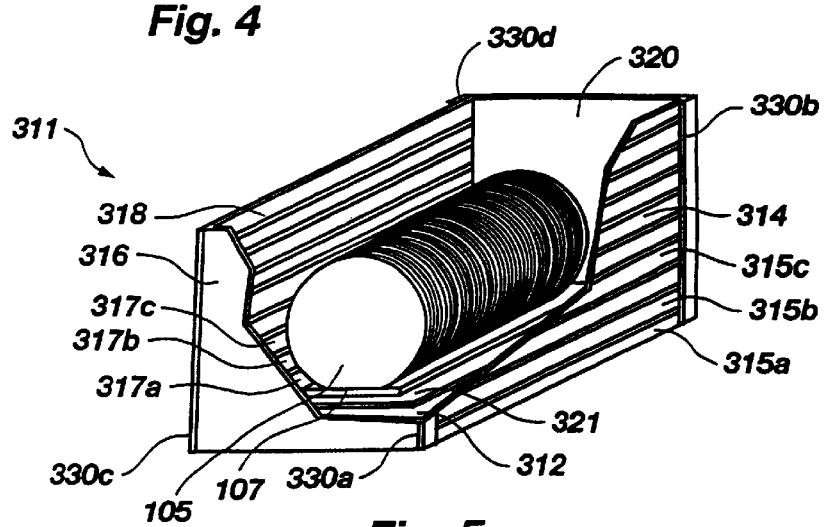
FIG. 5 is a perspective cutaway view of a third preferred embodiment of a rinse/dry chamber for use in the rinse dryer of the present invention.
Figure 5A:
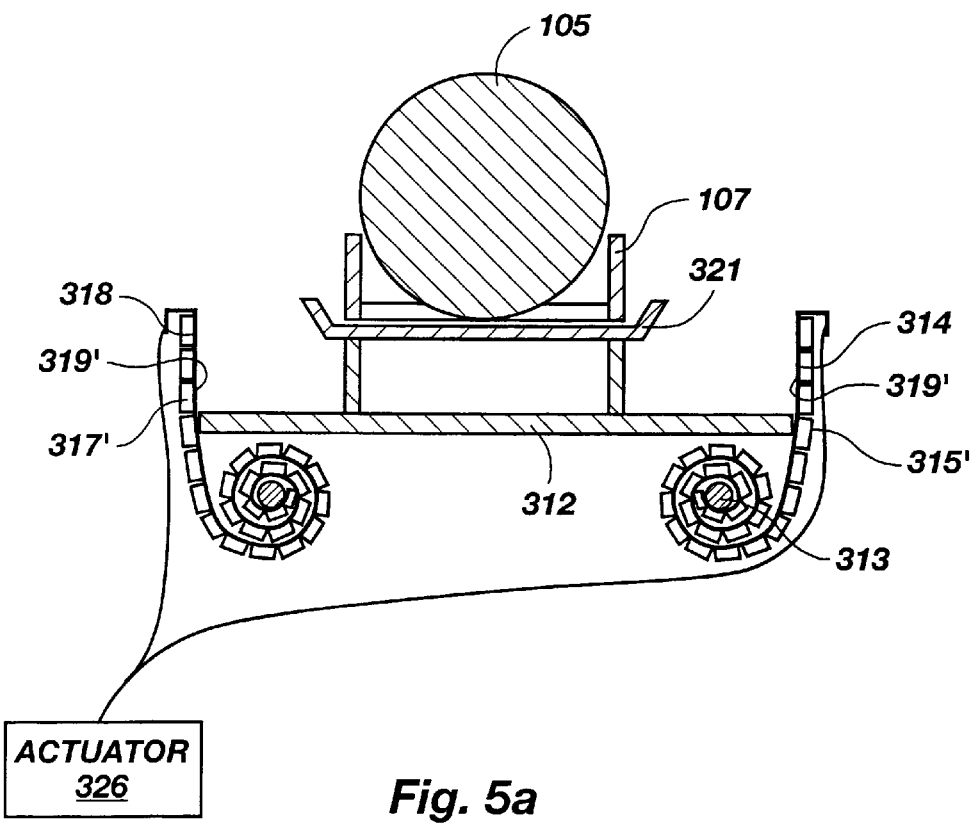
FIG. 5a is a cross-section of the embodiment shown in FIG. 5, with the wall in a lowered position.

FIG. 5 illustrates a third preferred embodiment of rinse/dry chamber 311, wherein a base 312 is surrounded by side walls 314, 318 and end walls 316, 320. Side walls 314, 318 fold or roll beneath the base as it is lowered relative thereto. In the illustrated embodiment, side walls 314 and 318 each have a plurality of slats 315a, 315b, 315c, etc. and 317a, 317b, 317c, etc., respectively. Preferably, adjacent slats 315a and 315b, 315b and 315c, etc. and 317a and 317b, 317b and 317c, etc. sealingly engage one another and are hingedly interconnected with each other in a tambour configuration. Alternatively, as shown in FIG. 5a, slats 315' and 317' may be bonded to a liquid impermeable sheet or film 319'. With reference to FIGS. 5 and 5a, as side walls 314 and 318 are lowered relative to base 312, the sides will wrap or roll under the base, eliminating the requirement for a substantial amount of space beneath the base that would be required by embodiments having a rigid wall. FIG. 5a shows side walls 314 and 318 rolled on spindles 313 beneath base 312.

Preferably, a sealing element 328 (not shown), such as seal element 128' described above in reference to FIGS. 3b and 3c, is located between each side wall 314, 318 and base 312 to form a watertight barrier between the base and each of the side walls as each such side wall is lowered (see FIG. 5). Thus, sealing element 328 is preferably disposed along each edge of the base which is adjacent to a rollable side (e.g., the edges of base 312 that are adjacent to side walls 314 and 318). Similarly, corner seals 330a, 330b, 330c and 330d, which are located at each of the vertical edges of side walls 314 and 318, are formed from similar materials to maintain the water-tightness of chamber 311 as the sides are lowered. Sealing mechanism 328 and corner seals 330a, 330b, 330c and 330d are each preferably made from a flexible, durable material that will withstand repeated and prolonged exposure to the rinse liquids, drying fluids, gases, other chemicals, temperatures, pressures and other conditions to which the sealing mechanism and corner seals will be exposed within the apparatus of this invention.

An actuator 326 is operatively connected to side walls 314 and 318 to raise and lower the side walls relative to base 312. Actuators mechanisms which are useful in the apparatus of the present invention include those discussed above in reference to FIGS. 1 through 3c. Actuator 326 for side walls 314 and 318 preferably comprises a variable speed electric motor for simplicity.

Preferably, chamber 311 also includes a removable tray 321, disposed upon base 312. A wafer carrier 107, which carries wafers 105, secures to base 312 above tray 321. Removable tray 321 has the same basic configuration and serves the same function as tray 121, disclosed above in reference to FIG. 1.

Although FIGS. 3a–c, 4 and 5 show specific, preferred embodiments of the wall, each having four sides, walls having shapes with three or more sides, or round, oval, elliptical, and other shapes of walls are also within the scope of the present invention. Similarly, the number of side walls that descend relative to the base may vary. Walls having only a portion thereof which descends relative to the base are also within the scope of the present invention.

Figure 6:
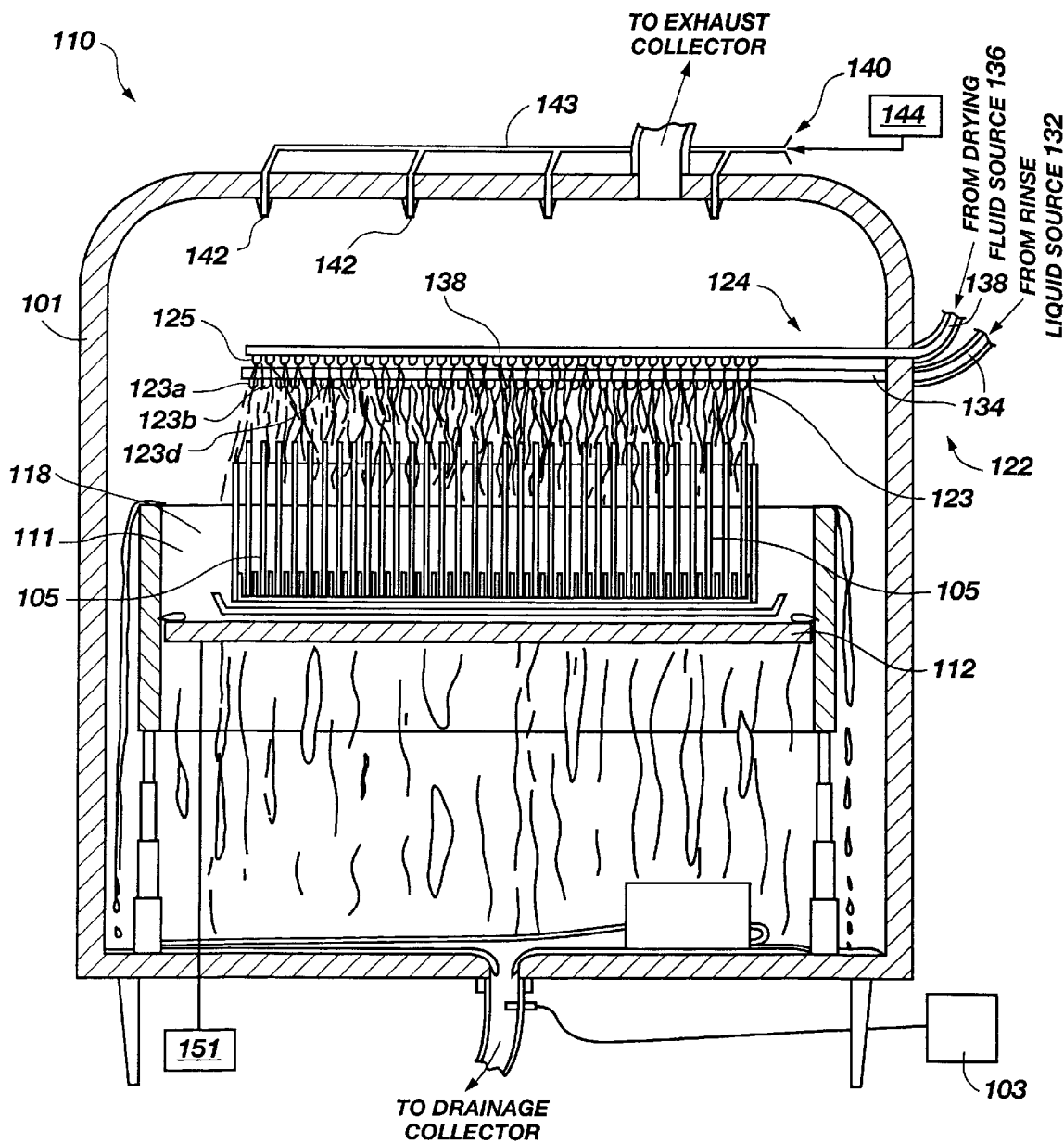
FIG. 6 is a cross-section taken through line 2—2 of FIG. 1, showing the wall in a partially lowered position and water flowing from the chamber.

Referring now to FIG. 6, which illustrates rinse dryer 110 with side walls 114 (not shown in FIG. 6), 118 in a partially lowered position relative to wafers 105 and base 112, water flows over the upper surfaces of the walls as they are lowered. Thus, as side walls 114, 118 are completely lowered, little or no water will remain on wafers 105 or on base 112.

With continued reference to FIG. 6, rinse liquid injection assembly 122 directs rinse liquid into chamber 111. Rinse liquid injection assembly 122 includes one or more spray flow ports 123, which are also referred to herein as heads, a rinse liquid source 132, and one or more lines 134 which transport rinse liquid from the source to the sprayers. Rinse liquid source 132 is preferably located outside of outer housing 101. Line 134 is preferably made from a flexible elastomeric tubing of the types known by those of ordinary skill in the relevant art.

A preferred embodiment of rinse liquid injection assembly 122 injects rinse liquid into chamber 111 as a pressurized stream or spray. Preferably, the pressurized rinse liquid is directed over the substantially flat surfaces of each of the mutually parallel wafers 105 to remove particulate contaminants therefrom. Thus, spray heads 123 of rinse liquid injection assembly 122 are preferably located within outer housing 101 above chamber 111 and wafers 105 located therein.

In order to direct rinse liquid at the substantially flat surfaces of each wafer 105, rinse liquid injection assembly 122 includes a plurality of spray heads 123a, 123b, 123c, etc. Spray heads 123 are each pointed in different directions to remove wash chemicals and contaminants from the surfaces of each of wafers 105. Alternatively, rinse liquid injection assembly 122 includes one or more spray heads (not shown) that are movable to several positions to direct a pressurized spray or stream of rinse liquid onto the surfaces of each of the wafers as the spray heads traverse across the wafer group.

Preferably, the pressure with which the spray heads eject rinse liquid is variable, facilitating optimization of the pressure for rinsing different types of wafers. For example, some existing spray heads eject rinse liquids at pressures in the 2,000 to 4,000 psi range. However, the relatively larger and thinner wafers (i.e., eight inch and ten inch wafers) that are finding increased use in the industry may not withstand such high rinse pressures. Thus, the rinse pressure can be modified to remove contaminants from the surface of the wafers without damaging the wafers. Liquid spray heads, pressure adjustment mechanisms, and spray head movement devices which are known to those of ordinary skill in the relevant art are useful as the rinse liquid injection assembly 122 of the apparatus of the present invention.

Figure 7:
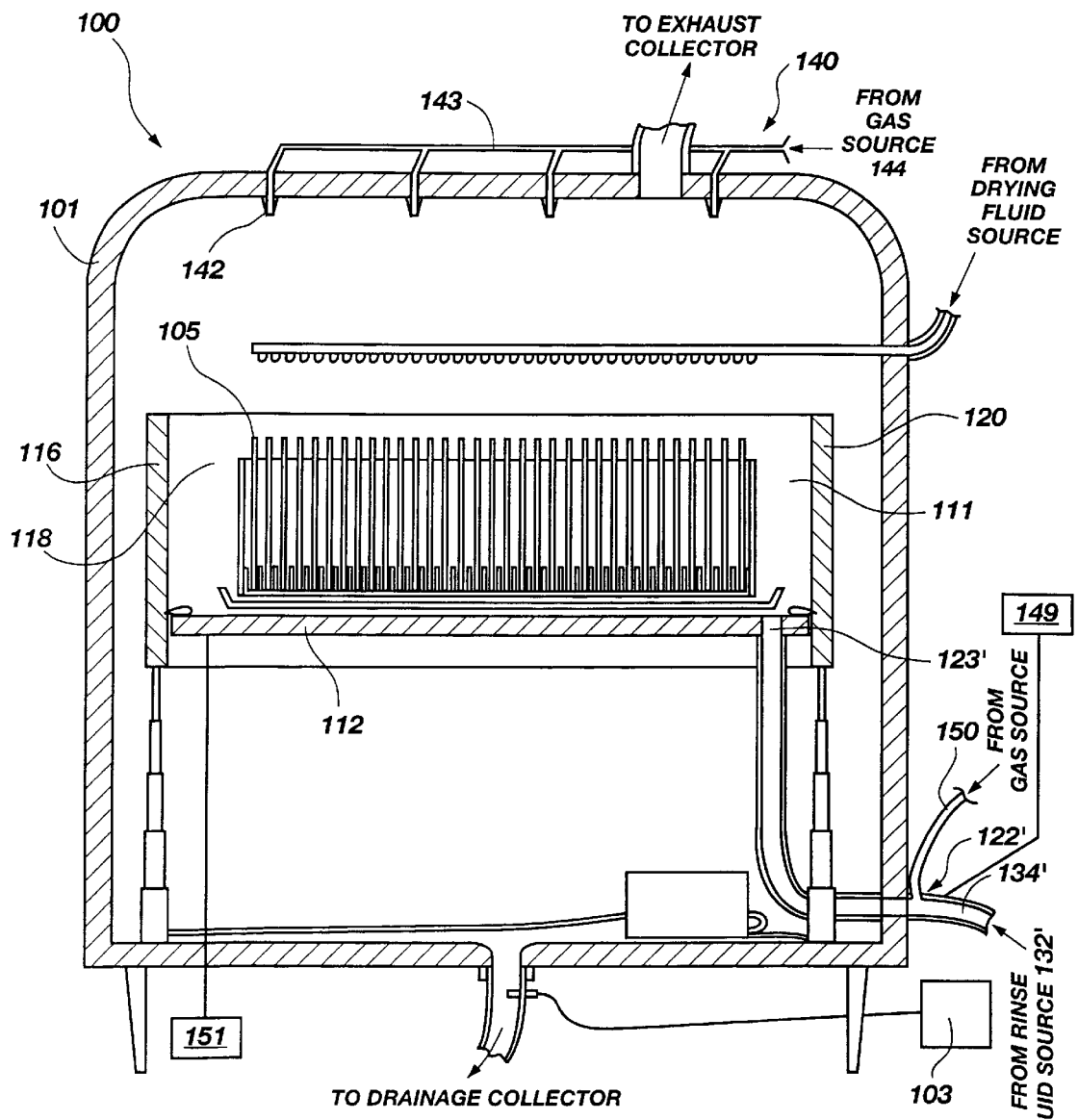
FIG. 7 is a cross-section taken through line 2—2 of FIG. 1, showing a preferred embodiment of a rinse liquid injection assembly and a bubbler.

FIG. 7 shows an alternative embodiment of rinse liquid injection assembly 122', wherein rinse liquid is flowed into chamber 111 from below to fill the chamber. Injection assembly 122' includes one or more flow ports 123', a rinse liquid source 132' and one or more lines 134' which transport rinse liquid from source 132' to the flow ports 123'. Preferably, source 132' is located outside of outer housing 101. Line 134' is preferably a flexible tubing such as the types known to those of ordinary skill in the relevant art for transporting liquids such as the rinse liquids that are used in the present invention. Rinse liquid flows into chamber 111 through flow ports 123', which extend through base 112, through one or more of side walls 114, 118, through one or more of end walls 116, 120, or comprise a conduit passing over the one or more of the side and/or end walls at one or more locations.

Rinse dryer 100 may also include an ozone ($O_3$) generator 149, which may be operatively associated with rinse liquid injection assembly 122 to introduce ozone into the rinse liquid. Ozone generators such as that manufactured by Legacy Systems Incorporated (model no. LOG-6DT) and that manufactured by Sorbios are useful in the apparatus of the present invention.

The rinse dryer 100 of the present invention may also include a bubbler 150 to facilitate removal of contaminants from wafers 105. Such bubblers are known by those of ordinary skill in the relevant art. Typically, bubblers introduce a stream of bubbles of nitrogen or another inert gas either into the bottom of the chamber or into the rinse liquid flowing into the chamber to enhance the rinsing action of the rinse liquid. As the bubbles move up through the rinse liquid and past wafers 105, they facilitate the mixing of the chemicals on the wafer surfaces with the rinse liquid and scrub the wafer surfaces.

A megasonic 151 may also be used in connection with the rinse dryer 100 of the present invention. Megasonic 151 is operatively associated with base 112 of chamber 111, and employs radiofreqency waves to vibrate wafers 105 and rinse liquid in order to further facilitate cleaning of the former. Exemplary megasonics that are useful with rinse dryer 100 include that manufactured by Verteq, Inc. of Santa Ana, Calif. and those manufactured by SubMicron Systems Corporation of Allentown, Pa.

Referring again to FIG. 6, a preferred embodiment of drying fluid injection assembly 124, which sprays a mist or vapor of drying fluid into chamber 111, is shown. Preferably, drying fluid contacts and covers both of the substantially flat, major surfaces of each wafer 105 to remove water therefrom. Drying fluid injection assembly 124 includes one or more drying fluid injection heads 125, a drying fluid source 136, and one or more lines 138 which transport drying fluid from the source to the drying fluid injection heads.

In the preferred embodiment of drying fluid injection assembly 124, the drying fluid is misted or vaporized at ambient temperature, using apparatus that are known in the art. Spray heads that will create a drying fluid mist are known to those of ordinary skill in the relevant industry. U.S. Pat. No. 5,653,045, issued to Ferrel, which is hereby incorporated by reference in its entirety, discloses an apparatus and method of vaporizing polar organic drying compounds. Alternatively, a stream of drying fluid may be sprayed, dripped, flowed or otherwise directed into chamber 111 through injection heads 125. Preferably, the drying fluid is injected into chamber 111 at a low volumetric rate and velocity to reduce the tendency of the drying fluid to mix with the rinse liquid. The use of rinse liquid spray heads 123 to inject drying fluid into chamber 111 is also within the scope of the present invention. The use of heated drying fluids and drying fluid vapors is also within the scope of the present invention.

Gas injection assembly 140 includes injection nozzles 142 which inject gas into outer housing 101, a gas source 144, and a line 143 which transports gas from the source to the nozzles. Preferably, the injected gas is an inert gas (e.g., nitrogen, argon, etc.). The inert gas displaces the rinse liquid and drying fluid from chamber 111 and facilitates the removal of residual drying fluid from the surfaces of wafers 105. Gas injection assemblies, including each of the above-identified elements and others, are known to those of ordinary skill in the relevant art.

Rinse liquids which are useful in the apparatus and method of the present invention include, but are not limited to, DI water, dilute acids, dilute bases, and others. Drying fluids that are useful in the apparatus and method of the present invention have a lower surface tension than the selected rinse liquid. Drying fluids which are useful in the present invention and which have a lower surface tension than most useful rinse liquids include, without limitation, isopropyl alcohol, propanol, 1-methoxy-2-propanol, di-acetone alcohol, and other fluids. Drying fluid vapors which may be used in the apparatus and method according to the present invention include, without limitation, propanol-rich nitrogen gas; isopropyl alcohol-rich nitrogen gas; nitrogen with traces of isopropyl alcohol, propanol, 1-methoxy-2-propanol, di-acetone alcohol, and others; argon with traces of or saturated with an appropriate drying fluid; or other carrier gases which include an appropriate drying fluid.

Referring again to FIG. 2, as an example of the use of the rinse dryer 100 of the present invention, a group of wafers 105, which is positioned in a mutually parallel relationship on a wafer carrier 107, is placed in outer housing 101 on base 112 and secured thereto. Side walls 114, 118 are then placed in their raised position. Wafers 105 are then rinsed. Any gases or vapors within outer housing 101 that are displaced by the rinse liquid exit the outer housing through exhaust conduit 104. Once chamber 111 becomes full with rinse liquid, and after wafers 105 have been rinsed, actuator 126 lowers side walls 114, 118 at a desired rate and rinse liquid exits housing 101 through drain 102.

Alternatively, side walls 114 and 118 may be placed in their raised position and chamber 111 filled with rinse liquid prior to placing the loaded wafer carrier 107 onto base 112. The side walls are then lowered as previously described to remove rinse liquid from chamber 111 and from the surfaces of wafers 105. This alternative use of the rinse dryer 100 is advantageous in situations where a quench is desired or necessary, for example, following a controlled etch of wafers 105 in order to remove an etchant.

The apparatus of the present invention is also employed to dry wafers 105. Drying fluid injection assembly 124 directs drying fluid onto the surface of the rinse liquid. Preferably, drying fluid is injected into outer housing 101 during the entire period of time during which side walls 114, 118 are being lowered. The manner in which the drying fluid is injected onto the surface of the rinse liquid is very important to the drying process. More particularly, the size, velocity and distribution of the drying fluid droplets must be carefully controlled in order to build a layer of the drying fluid film on the surface of the rinse liquid without the two fluids mixing. Preferably, injection head 125 directs the drying fluid at the surface of the rinse liquid at a low enough volumetric rate and velocity that the tendency of the drying fluid and rinse liquid to mix will be minimized.

As the drying fluid mist or vapor settles onto the exposed surface of the rinse liquid, it forms a film thereon which partially diffuses into the rinse liquid. Preferably, the flow velocity of the drying fluid onto the exposed surface of the rinse liquid is sufficient to build and maintain the film as the drying fluid diffuses into the rinse liquid. As the rinse liquid is slowly drained from chamber 111, the film of drying fluid is pulled onto the surfaces of wafers 105. The low surface tension of the drying fluid relative to the surface tension of the rinse liquid forces the rinse liquid from the surface of wafers 105 in a uniform sheet, removing substantially all of the rinse liquid and leaving only a small amount of drying fluid film on the surfaces of the wafers. This is known as the Marangoni effect, and is described in detail in J. Marra, Ultraclean Marangoni Drying, PARTICLES IN GASES AND LIQUIDS 3: DETECTION, CHARACTERIZTION AND CONTROL (1993), the relevant disclosure of which is hereby incorporated by reference.

Preferably, as the rinse liquid and drying fluid are drained from outer housing 101, they are displaced with a substantially inert gas such as nitrogen, argon, or another gas which is generally non-reactive with wafers 105 and will not contaminate the surfaces thereof. The displacing gas is pumped into outer housing 101 by gas injection assembly 140 (see FIG. 6). Preferably, the displacing gas is heated to a temperature in the range of from about 70° F. to about 185° F. to facilitate drying and to evaporate any remaining drying fluid from the surfaces of wafers 105. Excess gases and vapors exit outer housing 101 through exhaust conduit 104.

After the rinse liquid and drying fluid flow over the upper edges of side walls 114, 118, they are drained from outer housing 101 through drain 102. Preferably, as the rinse liquid and drying fluid flow through drain 102, the level of contaminants is measured by resistivity meter 103. If the resistivity of the drained liquids is above the desired level as measured by resistivity meter 103, the rinse and dry steps may be repeated.

Although the foregoing description contains many specificities, these should not be construed as limiting the scope of the present invention, but as merely providing illustrations of some of the presently preferred embodiments. Similarly, other embodiments of the invention may be devised which do not depart from the spirit or scope of the present invention. The scope of this invention is, therefore, indicated and limited only by the appended claims and their legal equivalents, rather than by the foregoing description. All additions, deletions and modifications to the invention as disclosed herein which fall within the meaning and scope of the claims are embraced within their scope.

What is claimed is:

1. An apparatus for rinsing and drying semiconductor wafers, comprising:
   a chamber including a base and at least one substantially vertically oriented wall extending upwardly from said base, at least a portion of said at least one substantially vertically oriented wall being movable vertically relative to and at least partially beneath said base, said chamber configured to have at least one semiconductor substrate placed therein;
   a rinse liquid injection assembly associated with said chamber so as to introduce rinse liquid into said chamber; and
   a drying fluid injection assembly associated with said chamber so as to introduce drying fluid into said chamber.

2. The apparatus of claim 1, wherein at least said portion of said at least one substantially vertically oriented wall is rigid.

3. The apparatus of claim 1, wherein at least said portion of said at least one substantially vertically oriented wall has a tambour configuration.

4. The apparatus of claim 1, wherein at least said portion of said at least one substantially vertically oriented wall comprises a plurality of hingedly interconnected slats.

5. The apparatus of claim 1, wherein at least said portion of said at least one substantially vertically oriented wall comprises a plurality of slats adhered to a pliable sheet.

6. The apparatus of claim 1, wherein at least said portion of said at least one substantially vertically oriented wall has an accordion configuration.

7. The apparatus of claim 1, further comprising: an actuator associated with at least said portion of said at least one substantially vertically oriented wall so as to effect movement thereof.

8. The apparatus of claim 7, wherein said actuator comprises a pneumatic actuator.

9. The apparatus of claim 7, wherein said actuator comprises a hydraulic actuator.

10. The apparatus of claim 7, wherein said actuator comprises a stepper motor.

11. The apparatus of claim 7, wherein said actuator comprises a screw drive.

12. The apparatus of claim 1, further comprising: a wafer carrier positionable over said base.

13. The apparatus of claim 12, wherein said wafer carrier is configured to carry a plurality of semiconductor substrates in a mutually parallel relationship to each other.

14. The apparatus of claim 1, further comprising a tray positionable above said base and configured to permit fluid flow therethrough.

15. The apparatus of claim 14, wherein said tray is configured to trap debris.

16. An apparatus for rinsing semiconductor wafers, comprising:
   a chamber including a base and at least one substantially vertically oriented wall extending upwardly therefrom, at least a portion of said at least one substantially vertically oriented wall being vertically movable relative to and at least partially below said base; and
   a rinse liquid injection assembly associated with said base so as to introduce rinse liquid into said chamber.

17. The apparatus of claim 16, wherein said at least said portion of said at least one substantially vertically oriented wall is in sealing contact with said base.

18. The apparatus of claim 16, further comprising:
   an actuator associated with at least said portion of said at least one substantially vertically oriented wall so as to effect movement of at least said portion.

19. The apparatus of claim 18, wherein said actuator controls a rate at which at least said portion of said at least one substantially vertically oriented wall moves relative to said base.

20. The apparatus of claim 16, wherein at least said portion of said at least one substantially vertically oriented wall is rigid.

21. The apparatus of claim 16, wherein at least said portion of said at least one substantially vertically oriented wall is collapsible.

22. The apparatus of claim 16, wherein at least said portion of said at least one substantially vertically oriented wall has a tambour configuration.

23. The apparatus of claim 16, further comprising:
   a drying fluid injection assembly associated with said base so as to introduce drying fluid into said chamber.

24. The apparatus of claim 23, wherein said drying fluid injection assembly is configured to introduce a quantity of vaporized drying fluid into said chamber.

25. The apparatus of claim 16, further comprising:
   a wafer carrier positionable over said base and configured to carry at least one semiconductor substrate.

26. The apparatus of claim 25, wherein said wafer carrier is configured to carry a plurality of semiconductor substrates in a mutually parallel relationship to each other.

27. The apparatus of claim 16, further comprising:
   a tray positionable over said base and configured to permit fluid flow therethrough.

28. The apparatus of claim 27, wherein said tray is configured to trap debris.

\* \* \* \* \*

UNITED STATES PATENT AND TRADEMARK OFFICE
CERTIFICATE OF CORRECTION

PATENT NO. : 6,460,554 B2  Page 1 of 2
DATED : October 8, 2002
INVENTOR(S) : Barry K. Florez It is certified that error appears in the above-identified patent and that said Letters Patent is hereby corrected as shown below:

Title page,
Item [56], References Cited, FOREIGN PATENT DOCUMENTS, first reference, delete "*"

Drawings,
Figure 3B, change the lead line of "121" to appropriately indicate the position of the removable tray 121; and please replace FIG 3B with the following:

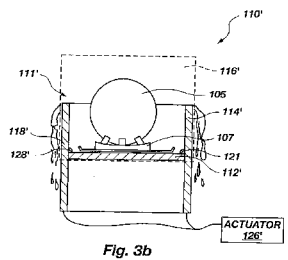

Fig. 3b

Figure 6, change "123d" to -- 123c --; and please replace FIG. 6 with the following:

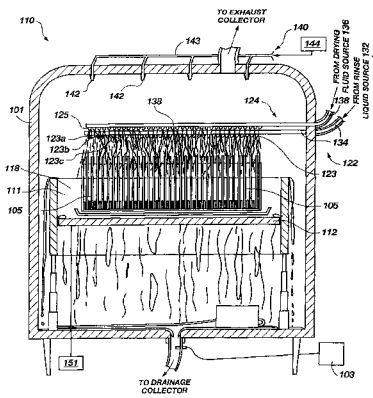

Fig. 6

Column 1,
Line 5, insert a hyphen between "CROSS" and "REFERENCE"
Line 47, insert a comma after "including" and insert a comma after "limitation"

Column 5,
Line 54, insert a comma after "including" and insert a comma after "limitation"

Column 6,
Line 66, insert a comma after "118" and insert a comma after "thereof"

UNITED STATES PATENT AND TRADEMARK OFFICE
CERTIFICATE OF CORRECTION

PATENT NO.   : 6,460,554 B2
DATED        : October 8, 2002
INVENTOR(S)  : Barry K. Florez It is certified that error appears in the above-identified patent and that said Letters Patent is hereby corrected as shown below:

Column 7,
Line 3, change "saw tooth-configured" to -- sawtooth-configured --
Line 31, insert a comma after "including" and insert a comma after "limitation"

Column 8,
Line 5, change "118 '" to -- 118', --
Line 6, insert a comma after "thereof"
Line 32, change "116'" to -- 118' --
Line 41, after "manner" insert -- (FIG. 4a) --

Column 9,
Line 32, change "comer" to -- corner --
Line 45, change "Actuators" to -- Actuator --
Line 55, change "1" to -- 2 --
Line 65, change "rinse dryer" to -- rinse/dry apparatus --

Column 10,
Line 62, after "114" and before the comma insert -- (not shown) --

Column 11,
Line 1, change "122" to -- 122' --
Line 20, change "radiofreqency" to -- radiofrequency --

Signed and Sealed this

Twenty-eighth Day of October, 2003

JAMES E. ROGAN
*Director of the United States Patent and Trademark Office*